(12) United States Patent
Liu (10) Patent No.: US 9,530,786 B2
(45) Date of Patent: Dec. 27, 2016

(54) MEMORY DEVICE AND METHOD FOR FABRICATING THE SAME

(71) Applicant: MACRONIX International Co., Ltd., Hsinchu (TW)

(72) Inventor: Kuang-Wen Liu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 191 days.

(21) Appl. No.: 14/476,273

(22) Filed: Sep. 3, 2014

(65) Prior Publication Data

US 2016/0064498 A1    Mar. 3, 2016

(51) Int. Cl.
*H01L 29/66* (2006.01)
*H01L 27/11* (2006.01)
*H01L 27/115* (2006.01)

(52) U.S. Cl.
CPC ... *H01L 27/11582* (2013.01); *H01L 27/11565* (2013.01)

(58) Field of Classification Search
CPC ............. H01L 29/792; H01L 29/66833; H01L 27/11568; H01L 27/115; H01L 21/28282
USPC .......................................................... 257/324
See application file for complete search history.

(56) References Cited

U.S. PATENT DOCUMENTS 9,227,456 B2 *  1/2016  Chien .................... B42D 15/02

\* cited by examiner

*Primary Examiner* — Monica D Harrison
(74) *Attorney, Agent, or Firm* — J.C. Patents (57) ABSTRACT

Provided is a memory device, including a plurality of gate pillar structures and a plurality of dielectric pillars. The gate pillar structures and the dielectric pillars are arranged alternately and separately along a first direction, and are arranged alternately and contact each other along a second direction. In addition, the gate pillar structures and the dielectric pillars are embedded in a stack layer along a third direction, thereby dividing the stack layer into a plurality of stack structures. A sidewall of each of the dielectric pillars in the second direction and a sidewall of the adjacent gate pillar structure in the second direction are not coplanar.

20 Claims, 5 Drawing Sheets

MEMORY DEVICE AND METHOD FOR FABRICATING THE SAME

BACKGROUND OF THE INVENTION

1. Field of the Invention

The invention relates to a semiconductor device and a method for fabricating the same, and particularly relates to a memory device and a method for fabricating the same.

2. Description of Related Art

With the continuous development of science and technology, the demands to the storage capability also increases as the electronic products continue to improve. To improve the storage capability, memory devices become smaller and have a greater integrity. Thus, the industries now highly focus on three-dimensional memory devices.

However, as the integrity of three-dimensional memory devices continues to increase, the defects found in the fabricating process of vertical gates due to a high aspect ratio and stacking of composite films are more and more common. The defects include bit line channel bending, word line bridging, etc. Moreover, as the size of memory devices becomes smaller, an influence of the interference between adjacent memory cells on the performance of the memory cells or a memory cell array becomes more and more serious. Therefore, how to develop a memory device having a high integrity and a method for fabricating the same to avoid bit line channel bending and word line bridging has now become an important issue to be touched upon.

SUMMARY OF THE INVENTION

The invention provides a memory device and a method for fabricating the same capable of solving bit line channel bending and word line bridging in a fabricating process of vertical gates.

The invention provides a memory device and a method for fabricating the same capable of reducing interference between adjacent memory cells, thereby improving performance of the memory cells or a memory array.

The invention provides a memory device and a method for fabricating the same applicable to charge trapping memory, non-volatile memory, and embedded memory.

The invention provides a memory device, including a plurality of gate pillar structures and a plurality of dielectric pillars. The gate pillar structures and the dielectric pillars are arranged alternately and separately along a first direction, and are arranged alternately and contact each other along a second direction. In addition, the gate pillar structures and the dielectric pillars are embedded in a stack layer along a third direction, thereby dividing the stack layer into a plurality of stack structures. The first direction is different from the second direction, and is different from the third direction. A sidewall of each of the dielectric pillars in the second direction and a sidewall of the adjacent gate pillar structure in the second direction are not coplanar.

According to an embodiment of the invention, a width of each of the dielectric pillars in the first direction is greater than or equal to a width of the adjacent gate pillar structure in the first direction.

According to an embodiment of the invention, a contact area of each of the conductive pillars and the corresponding charge storage layer is greater than or equal to a contact area of the charge storage layer and the corresponding stack structure.

According to an embodiment of the invention, each of the stack structures comprises a plurality of insulating layers and a plurality of conductive layers, and the insulating layers and the conductive layers are stacked alternately along the third direction.

The invention provides a memory device including a substrate, a plurality of word lines, a plurality of isolation structures, a plurality of stack structures, a plurality of gate pillar structures, and a plurality of dielectric pillars. The substrate has a plurality of first regions, a plurality of second regions, and a plurality of third regions. The first regions and the second regions are arranged alternately along a first direction. Each of the third regions is located between the corresponding first region and second region. The plurality of word lines are located on the substrate. Each of the word lines extends along a first direction, and traverses the first regions, the second regions, and the third regions. The plurality of isolation structures are located on the substrate and between two adjacent word lines. Each of the isolation structures extends along a first direction, and traverses the first regions, the second regions, and the third regions. A plurality of stack structures are located on the substrate in the third regions. Each of the stack structures extends along the second direction, and traverses the word lines and the isolation structures. A plurality of gate pillar structures are located on the word lines. Each of the gate pillar structures extends along the third direction. Each of the gate pillar structures includes a plurality of conductive pillars and a plurality of charge storage layer. The conductive pillars are respectively electrically connected with the even word lines in the first regions and electrically connected with the odd word lines in the second regions. Each of the charge storage layers is located at a periphery of the corresponding conductive pillar to electrically isolate the corresponding stack structure and the conductive pillar. The first direction is different from the second direction, and is different from the third direction. The plurality of dielectric pillars are located on the word lines. Each of the dielectric pillars extends along the third direction, and the dielectric pillars contact the odd word lines in the first regions and contact the even word lines in the second regions.

According to an embodiment of the invention, a shape of a sidewall of the stack structure in the third region between the gate pillar structures and the dielectric pillars in each of the first regions and the gate pillar structures and the dielectric pillars in the adjacent second region comprises a sawtoothed shape or a serpentine shape.

According to an embodiment of the invention, each of the gate pillar structures and the adjacent dielectric pillar contacts each other on the corresponding isolation structure.

According to an embodiment of the invention, a width of each of the dielectric pillars in the first direction is greater than or equal to a width of the adjacent gate pillar structure in the first direction.

According to an embodiment of the invention, a contact area of each of the conductive pillars and the corresponding charge storage layer is greater than or equal to a contact area of the charge storage layer and the corresponding stack structure.

According to an embodiment of the invention, the third direction is perpendicular to the first direction and the second direction, and the first direction is perpendicular to the second direction.

According to an embodiment of the invention, each of the stack structures includes a plurality of insulating layers and a plurality of conductive layers, and the insulating layers and the conductive layers are stacked alternately along the third direction.

The invention provides a method for fabricating a memory device, including forming a stack layer on a substrate. A plurality of gate pillar structure and a plurality of dielectric pillars are formed in the stack layer. The gate pillar structures and the dielectric pillars are arranged separately and alternately along a first direction, arranged alternately and contact each other along a second direction, and are respectively embedded in the stack layer along a third direction, thereby dividing the stack layer into a plurality of stack structures extending along the second direction, The first direction is different from the second direction, and is different from the third direction. A sidewall of each of the dielectric pillars in the second direction and a sidewall of the adjacent gate pillar structure in the second direction are not coplanar.

According to an embodiment of the invention, the method for fabricating the memory device includes steps as follows. A substrate having a plurality of first regions, a plurality of second regions, and a plurality of third regions are provided. The first regions and the second regions are arranged alternately along a first direction. Each of the third regions is located between the corresponding first region and second region. Then, a plurality of word lines are formed on the substrate. Each of the word lines extends along a first direction, and traverses the first regions, the second regions, and the third regions. Then, an isolation structure is formed between two adjacent word lines. Each of the isolation structures extends along a first direction, and traverses the first regions, the second regions, and the third regions. The word lines and the isolation structures are alternately arranged along a second direction. A stack layer is formed on the substrate. A plurality of first holes are formed in the stack layer on the word lines, The first holes expose top surfaces of the even word lines in the first regions and expose top surfaces of the odd word lines in the second regions. A gate pillar structure is formed in each of the first holes. Each of the gate pillar structures includes a conductive pillar and a charge storage layer. The conductive pillars are respectively electrically connected with the even word lines in the first regions and electrically connected with the odd word lines in the second regions. Each of the charge storage layers is located at a periphery of the corresponding conductive pillar to electrically isolate the corresponding stack layer and the conductive pillar. A plurality of second holes are formed in the stack layer on the word lines. The second holes expose top surfaces of the odd word lines in the first regions and expose top surfaces of the even word lines in the second regions. The second holes and the gate pillar structures are alternately arranged along the first direction and the second direction. Each of the second holes contacts the adjacent gate pillar structure on the corresponding isolation structure, such that the stack layer is divided into the plurality of stack structures in the third regions. The stack structures extend along the second direction. A dielectric pillar is formed in each of the second holes.

According to an embodiment of the invention, the step of forming the corresponding gate pillar structure in each of the first holes is as follows. A charge storage material layer is formed on the substrate. The charge storage material layer covers a top surface of the stack layer, sidewalls of the first holes, and top surfaces of the word lines. A part of the charge storage material layer is removed by performing an anisotropic etching process to expose the top surfaces of the stack layer and the word lines, thereby forming a charge storage layer on the sidewall of each of the first holes. Then, a conductive pillar is formed in each of the first holes, such that each of the charge storage layers is located at the periphery of the corresponding conductive pillar.

According to an embodiment of the invention, the step of forming the corresponding dielectric pillar in each of the second holes is as follows. A dielectric material layer is formed on the substrate. The dielectric material layer is filled in the second holes. Then, a planarization process to the dielectric material layer is performed so as to expose the top surfaces of the gate pillar structures and the stack structures.

According to an embodiment of the invention, a shape of a sidewall of the stack structure in the third region between the gate pillar structures and the dielectric pillars in each of the first regions and the gate pillar structures and the dielectric pillars in adjacent second region comprises a sawtoothed shape or a serpentine shape.

According to an embodiment of the invention, a width of each of the dielectric pillars in the first direction is greater than or equal to a width of the adjacent gate pillar structure in the first direction.

According to an embodiment of the invention, a contact area of each of the conductive pillars and the corresponding charge storage layer is greater than or equal to a contact area of the charge storage layer and the corresponding stack structure.

According to an embodiment of the invention, the stack layer includes a plurality of insulating layers and a plurality of conductive layers. The insulating layers and the conductive layers are stacked alternately along the third direction.

According to an embodiment of the invention, the third direction is perpendicular to the first direction and the second direction, and the first direction is perpendicular to the second direction.

Based on the above, in the invention, by embedding the plurality of gate pillar structures and the plurality of dielectric pillars arranged alternately in the stack layer in the first regions and the second regions, the stack layer is divided into the plurality of stack structures (serving as bit lines, for example). In this way, the memory device and the method of fabricating the same according to the embodiments of the invention avoid the issue of bit line channel bending or word line bridging. In addition, the dielectric pillars electrically isolate the gate pillar structures and the stack structures. Therefore, the interference between the adjacent memory cells may be reduced, thereby improving the performance of the memory cells or the memory cell array.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are top schematic view illustrating a method for fabricating a memory device according to an embodiment of the invention. FIGS. 2A to 2E are cross-sectional schematic views along an A-A' line in FIGS. 1A to 1E.

Figure 1A:
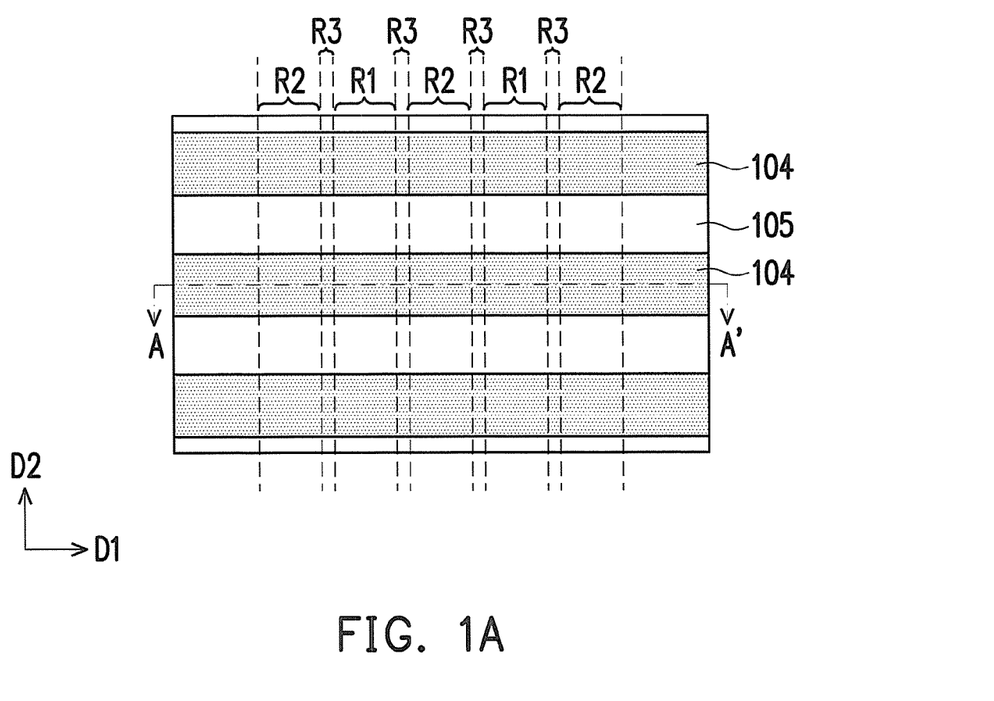
FIGS. 1A to 1E are top schematic view illustrating a method for fabricating a memory device according to an embodiment of the invention.
Figure 2A:
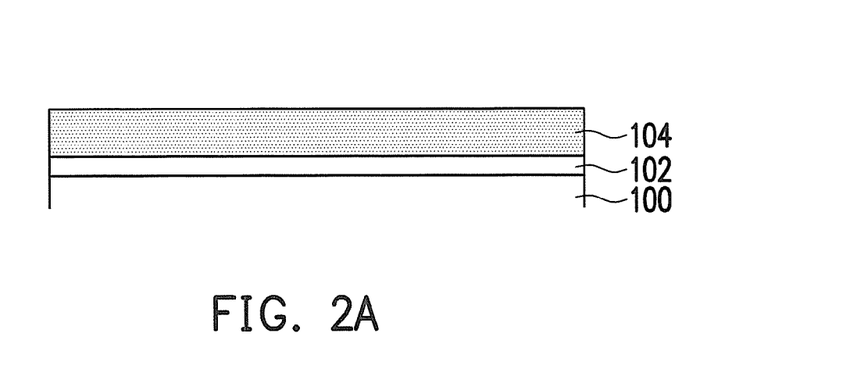
FIGS. 2A to 2E are cross-sectional schematic views along an A-A' line in FIGS. 1A to 1E.

Referring to FIGS. 1A and 2A together, a substrate 100 is a semiconductor substrate, a semiconductor compound substrate, or a semiconductor over insulator (SOI) substrate, for example. The semiconductor is atoms of IVA Group, for example, such as silicon or germanium. The semiconductor compound is a semiconductor compound formed of atoms of IVA group, for example, such as silicon carbide or silicon germanium, or atoms of IIIA Group and VA Group, such as gallium arsenide. The substrate 100 has a plurality of first regions R1, a plurality of second regions R2, and a plurality of third regions R3. The first regions R1 and the second regions R2 are alternately arranged along the first direction D1. Each of the third regions R3 is located between the corresponding first region R1 and second region R2.

Then, a plurality of word lines 104 are formed on the substrate 100. Each of the word lines 104 extends along a first direction D1, and traverses the first regions R1, the second regions R2, and the third regions R3. Specifically, an isolation material layer and a word line material layer (not shown) are sequentially formed on the substrate 100. Then, a photolithography process and an etching process are performed to the isolation material layer and the word line material layer, so as to form a plurality of isolation layers 102 and the plurality of word lines 104 on the substrate 100. Each of the isolation layers 102 and each of the word lines 104 extend along the first direction D1 and traverse the first regions R1, the second regions R2, and the third regions R3. The etching process may be a dry etching process, for example, and the dry etching process may be a reactive ion etching (RIE) process, for example. In an embodiment, a material of the isolation layers 102 may include an insulating material, such as silicon oxide or a low dielectric constant material layer having a dielectric constant lower than 4. A method for forming the isolation layers 102 may be the chemical vapor deposition method or the thermal oxidation method. A material of the word lines 104 may include polysilicon, metal silicide, metal, or a combination thereof, and a method of forming the word lines 104 may be the chemical vapor deposition method. The metal silicide may be tungsten silicide, cobalt silicide, nickel silicide, titanium silicide, copper silicide, molybdenum silicide, tantalum silicide, erbium silicide, zirconium silicide, or platinum silicide, for example.

Then, an isolation structure 105 is formed between two adjacent word lines 104. Each of the isolation structures 105 extends along the first direction D1 and traverses the first regions R1, the second regions R2, and the third regions R3. Specifically, the isolation structure material layer (not shown) is formed on the substrate 100, and then an etching back process is performed to the isolation structure material layer to form the isolation structure 105 between two adjacent word lines 104. Each of the isolation structures 105 is disposed between two adjacent word lines, and the word lines 104 and the isolation structures 105 are alternately arranged in a second direction, such that each of the word lines 104 is electrically isolated from each other. A material of the isolation structures 105 includes silicon oxide or a low dielectric constant material layer having a dielectric constant lower than 4, and a method of forming the isolation structures 105 may be the chemical vapor deposition method.

Figure 1B:
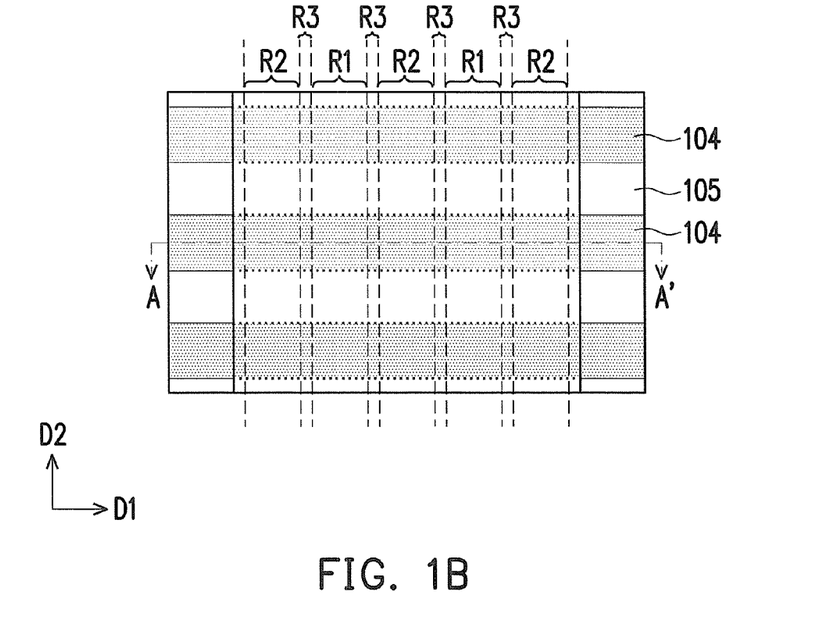
Figure 2B:
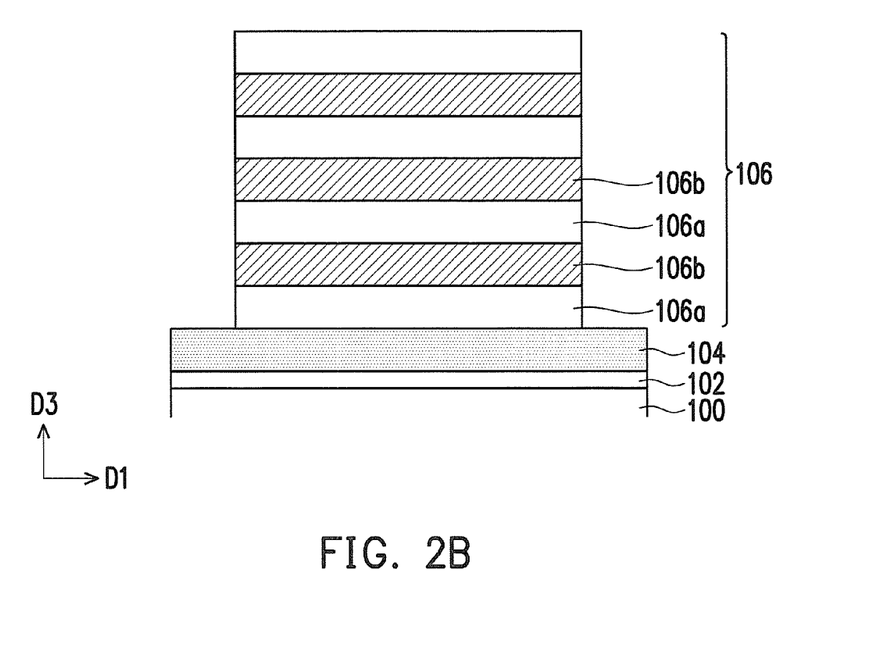

Referring to FIGS. 1B and 2B together, a stack layer 106 is formed on the substrate 100. The stack layers 106 includes a plurality of insulating layers 106a and a plurality of conductive layers 106b, and the insulating layers 106a and the conductive layers 106b are stacked alternately along a third direction D3. The third direction D3 is different from the first direction D1 and the second direction D2. In an embodiment, the third direction D3 is substantially perpendicular to the first direction D1 and the second direction D2, and the first direction D1 is substantially perpendicular to the second direction D2.

In an embodiment, the number of layers of the conductive layers 106b may be 8, 16, 32, or more. Similarly, the insulating layer 106a is disposed between two adjacent conductive layers 160b, so the number of layers of the insulating layers 106a may be 8, 16, 32, or more. In an embodiment, a material of the insulating layers 106a may include silicon oxide, silicon nitride, or a combination thereof, and a method of forming the insulating layers 106a may be the chemical vapor deposition method. A material of the conductive layers 106b may be doped polysilicon, undoped polysilicon, or a combination thereof, and a method of forming the conductive layers 106b may be the chemical vapor deposition method.

Figure 1C:
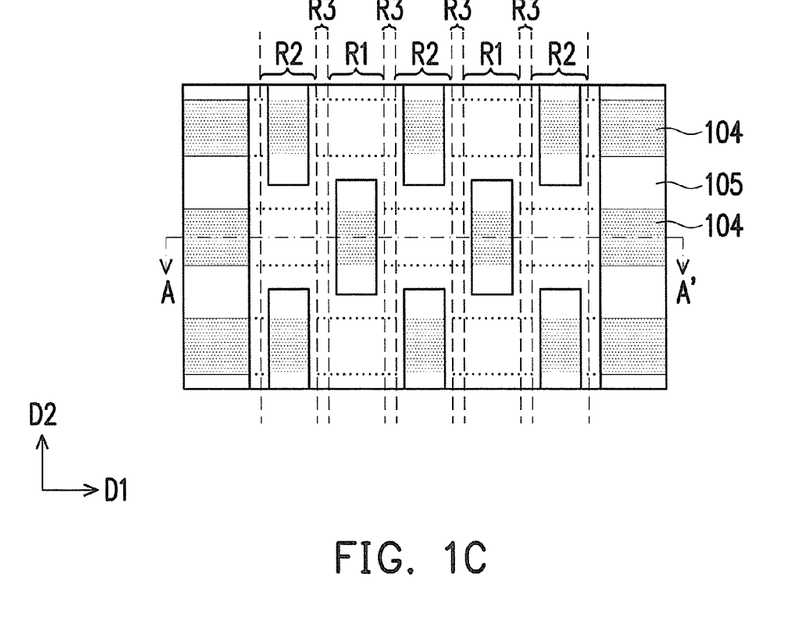
Figure 2C:
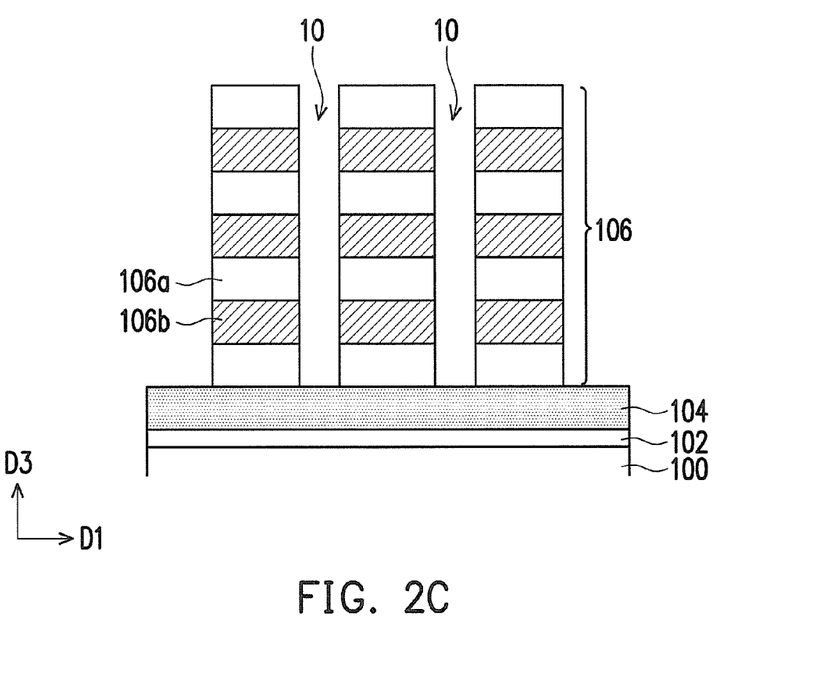

Referring to FIGS. 1C and 2C together, a photolithography process and an etching process are performed to the stack layer 106, so as to form a plurality of first holes 10 in the stack layer 106 on the word lines 104 in the first regions R1. The first holes 10 in the first regions R1 and the first holes 10 in the second regions R2 are alternately arranged with respect to each other. More specifically, the first holes 10 extend along a third direction D3 and respectively expose the even word lines 104 in the first regions R1 and the odd word lines 104 in the second regions R2. In an embodiment, a shape of the first holes 10 may be circular, square, rectangular, or an arbitrary shape, for example, as long as the first holes 10 penetrate the stack layer 106 to expose top surfaces of the corresponding word lines 104 after the photolithography process and the etching process. A size of each of the first holes 10 may be greater or equal to a width of the corresponding word line 104, as long as the first hole 10 is not connected to any adjacent first hole 10. The etching process may be a dry etching process, for example, and the dry etching process may be a reactive ion etching (RIE) process, for example. When the first holes 10 are formed in the stack layer 106, portions of the remained stack layer 106 that the first holes 10 are not formed therein are structurally connected to each other, thereby supporting each other to avoid collapsing or bending.

Figure 1D:
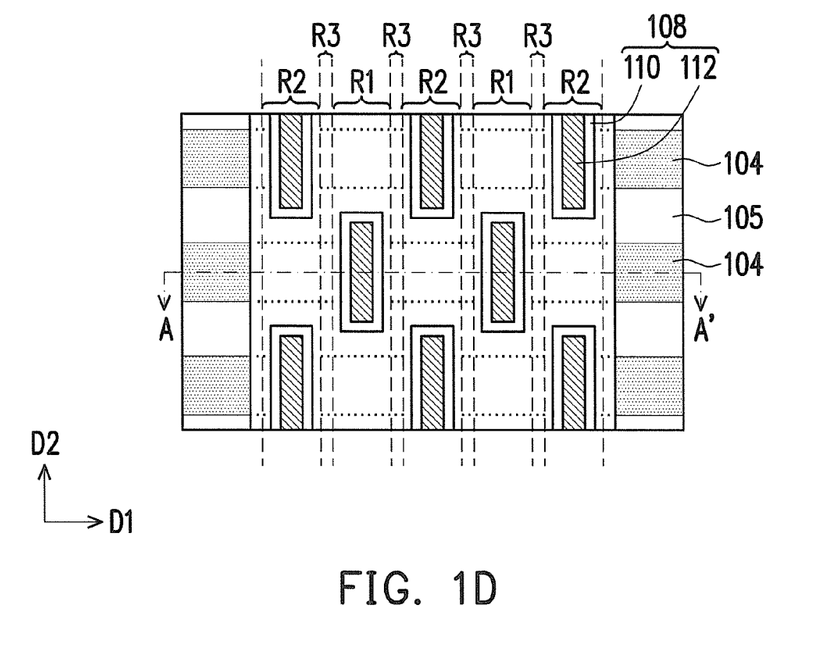
Figure 2D:
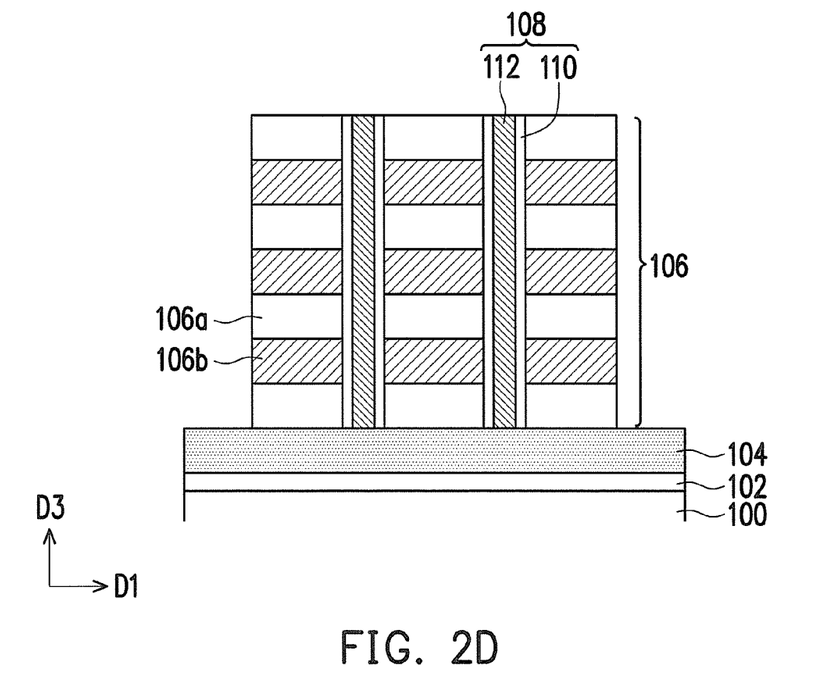

Referring to FIGS. 1D and 2D together, a gate pillar structure 108 is formed in each of the first holes 10. The gate pillar structures 108 in the first regions R1 and the gate pillar structures 108 in the second regions R2 are alternately arranged. More specifically, each of the gate pillar structures 108 extends along the third direction D3, and includes a charge storage layer 110 and a conductive pillar 112 (serving as a control gate, for example). The conductive pillars 112 are respectively electrically connected with the even word lines 104 in the first regions R1 and electrically connected with the odd word lines 104 in the second regions R2. Therefore, each of the conductive pillars 112 may serve as an extension of the corresponding word line 104. Each of the charge storage layers 110 is located at a periphery of the corresponding conductive pillar 112, such that the corresponding plurality of conductive layers 106b in the stack layer 106 are electrically isolated from the conductive pillar 112. Specifically, steps of forming the corresponding gate pillar structure 108 in each of the first holes 10 are described as follows. First of all, a charge storage material layer (not shown) is formed on the substrate 100. The charge storage material layer covers a top surface of the stack layer 106, a sidewall of the first hole 10, and the top surface of the word line 104. Then, a conductive material layer is formed on the charge storage material layer. Subsequently, a part of the charge storage material layer and a part of the conductive material layer are removed to expose the top surfaces of the stack layer 106 and the word line 104 by performing a chemical-mechanical polishing (CMP) process or an anisotropic etching process, such that the charge storage layer 110 and the conductive pillar 112 are formed on the sidewall of each of the first holes 10. In an embodiment, a material of the charge storage material layer may include an oxide layer, a nitride layer, or a composite layer of an arbitrary combination thereof. The composite layer may include three or more layers, and the invention is not limited thereto. A method of forming the charge storage material layer may be the chemical vapor deposition method, the thermal oxidation method, etc. For example, the charge storage material layer may include a composite layer such as an oxide/nitride/oxide (ONO) layer, an oxide/nitride/oxide/nitride (ONON) layer, etc. In an embodiment, a material of the conductive material layer may include polysilicon, metal silicide, metal, or a combination thereof, and a method of forming the conductive material layer may be the chemical vapour deposition method. The metal silicide may be tungsten silicide or cobalt silicide, nickel silicide, titanium silicide, copper silicide, molybdenum silicide, tantalum silicide, erbium silicide, zirconium silicide, or platinum silicide, for example.

Figure 1E:
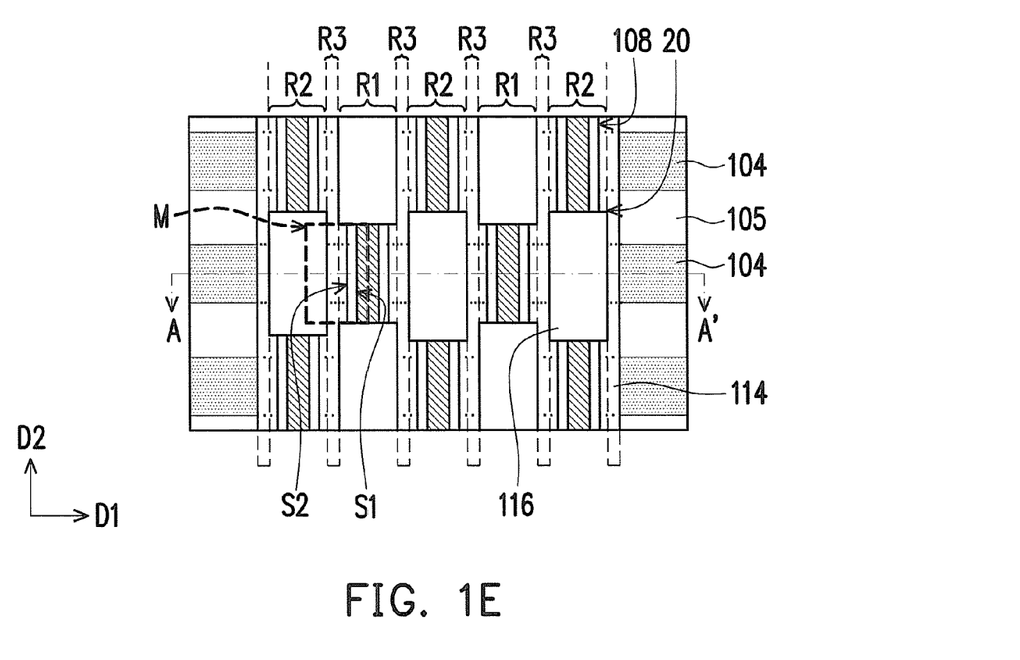
Figure 2E:
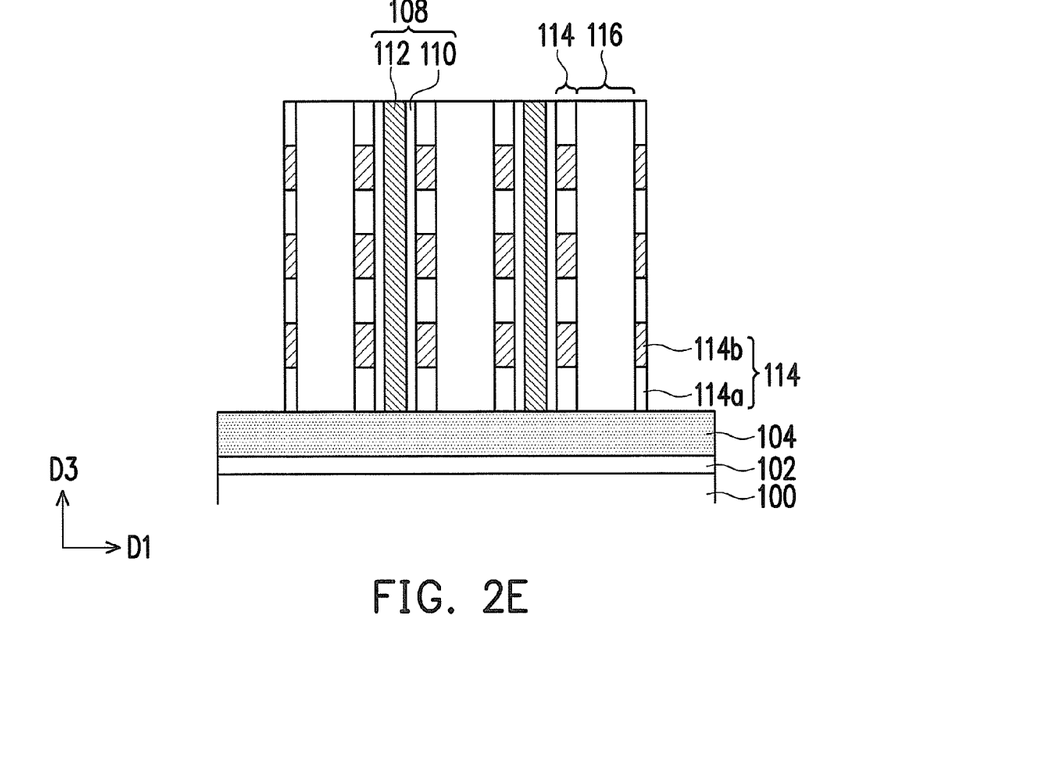

Referring to FIGS. 1E and 2E together, a plurality of dielectric pillars 116 are formed in the stack layer 106. The dielectric pillars 116 in the first regions R1 and the dielectric pillars 116 in the second regions R2 are arranged alternately. More specifically, the dielectric pillars 116 are located on the odd word lines 104 in the first regions R1 and the even word lines 104 in the second regions R2. Each of the dielectric pillars 116 extends along the third direction D3. Moreover, in the first direction D1, the dielectric pillars 116 and the gate pillar structures 108 are alternately arranged. In the second direction D2, the dielectric pillars 116 and the gate pillar structures 108 are alternately arranged and contact each other, such that the gate pillar structures 108 and stack structures 114 are electrically isolated from each other.

Specifically, first of all, a photolithography process and an etching process are performed to the stack layer 106 to form a plurality of second holes 20 in the stack layer 106 on the word lines 104. The second holes 20 in the first regions R1 and the second holes 20 in the second regions R2 are alternately arranged with respect to each other. More specifically, the second holes 20 expose the top surfaces of the odd word lines 104 in the first regions R1, and expose the top surfaces of the even word lines 104 in the second regions R2. The second holes 20 and the gate pillar structures 108 are alternately arranged along the first direction D1 and are alternately arranged along the second direction D2. A sidewall of each of the second holes 20 exposes the gate pillar structure 108 adjacent thereto. In an embodiment, a shape of the second holes 20 may be circular, square, rectangular, or an arbitrary shape, for example, as long as the second holes 20 penetrate the stack layer 106 to the expose top surfaces of the corresponding word lines 104 after the photolithography process and the etching process. A size of each of the second holes 20 may be greater than or equal to the width of the corresponding word line 104, as long as each of the second holes 20 exposes the sidewalls of the corresponding gate pillar structures 108. In an embodiment, the etching process may be a dry etching process, for example, and the dry etching process may be a reactive ion etching process, for example. When the second holes 20 are formed in the stack layer 106 in the embodiments of the invention, although the stack layer 106 is already patterned to form the stripe-shaped stack structures 114, the stack structures 114 may be supported by the structurally connected gate pillar structures 108, thereby avoiding collapsing or bending of the stack structures 114.

Then, a dielectric material layer (not shown) is formed on the substrate 100. The dielectric material layer is filled into the second holes 20. A material of the dielectric material layer may include silicon oxide, silicon nitride, or a combination thereof, and a method of forming the dielectric material layer may be the chemical vapor deposition method. Subsequently, a planarization process is performed to the dielectric material layer to expose the top surfaces of the gate pillar structures 108 and the stack structures 114, such that a plurality of the dielectric pillars 116 are formed in the second holes 20. In an embodiment, the planarization process may be a chemical-mechanical polishing (CMP) process.

In the above embodiment, by embedding the dielectric pillars 116 and the gate pillar structures 108 in the stack layer 106 in the first regions R1 and the second regions R2, the stack layer 106 may be divided into the plurality of stack structures 114. The stack structures 114 extend along the second direction D2 and are located in the third regions R3 between the first regions R1 and the second regions R2. In addition, the stack structures 114 traverse the plurality of word lines 104 and the plurality of isolation structures 105. When any of the dielectric pillars 116 and the gate pillar structures 108 are not in a rectangular shape and are different in size, a sidewall of each of the dielectric pillars 116 in the second direction D2 and a sidewall of the adjacent gate pillar structure 108 in the second direction D2 are not coplanar, making sidewalls of the stack structures 114 not flat surfaces. Instead, a shape of the sidewalls thereof includes a sawtoothed shape or a serpentine shape.

In addition, each of the gate pillar structures 108 and the corresponding stack structure 114 form a memory cell string. For the memory cell strings, the dielectric pillar 116 is disposed between two adjacent memory cell strings in the first direction D1 and between two adjacent memory cell strings in the second direction D2. Therefore, the dielectric pillars 116 may serve to electrically isolate the adjacent memory cells to reduce interference between the adjacent memory cells, thereby improving performance of the memory cells and a memory cell array.

In the above embodiment, it is described that the plurality of gate pillar structures that are alternately arranged are embedded in the stack layer, and then the plurality of dielectric pillars that are alternately arranged are embedded, so as to divide the stack layer into the plurality of stripe-shaped stack structures. However, the invention is not limited thereto. In other embodiments, it is also possible to embed the plurality of dielectric pillars that are alternately arranged in the stack layer first, and then embed the plurality of gate pillar structures that are alternately arranged, so as to divide the stack layer into the plurality of stripe-shaped stack structures.

Referring to FIGS. 1E and 2E together, the memory device of this embodiment of the invention includes the substrate 100, the plurality of word lines 104, the plurality of isolation structures 105, the plurality of gate pillar structures 108, the plurality of stack structures 114 (serving as a plurality of bit lines, for example), and the plurality of dielectric pillars 116.

The substrate 100 has the plurality of first regions R1, the plurality of second regions R2, and the plurality of third regions R3. The first regions R1 and the second regions R2 are alternately arranged along the first direction D1. Each of the third regions R3 is located between the corresponding first region R1 and second region R2. The plurality of word lines 104 are located on the substrate 100. Each of the word lines 104 extends along the first direction D1, and traverses the first regions R1, the second regions R2, and the third regions R3. The plurality of isolation structures 105 are located on the substrate 100 and between two adjacent word lines 104. Each of the isolation structures 105 extends along the first direction D1 and traverses the first regions R1, the second regions R2, and the third regions R3.

The plurality of stack structures 114 (serving as bit lines, for example), are located on the substrate 110 in the third regions R3. Each of the stack structures 114 extends along the second direction D2, and traverses the word lines 104 and the isolation structures 105. Each of the stack structures 114 includes the plurality of insulating layers 114a and the plurality of conductive layers 114b. The insulating layers 114a and the conductive layers 114b are stacked alternately along the third direction D3, as shown in FIG. 2E. At two sides of each of the stack structures 114, the gate pillar structure 108 and the dielectric pillar 116 opposite to each other are respectively disposed. In addition, the gate pillar structures 108 and the dielectric pillars 106 at any side of the stack structures 114 are alternately arranged.

The plurality of gate pillar structures 108 are alternately arranged and located on the word lines 104 in the first regions R1 and the second regions R2 at the two sides of the stack structures 114. More specifically, each of the gate pillar structures 108 extends along the third direction D3, and each of the gate pillar structures 108 includes the charge storage layer 110 and the conductive pillar 112 (serving as a control gate, for example). The conductive pillars 112 in the first regions R1 are disposed on the even word lines 104 and electrically connected thereto, and the conductive pillars 112 in the second regions R2 are disposed on the odd word lines 104 and electrically connected thereto. Each of the charge storage layers 110 is located at the periphery of the corresponding conductive pillar 112 to electrically isolate the corresponding stack structure 114 and the conductive pillar 112. The first direction D1 is different from the second direction D2, and is different from the third direction D3. In an embodiment, the third direction D3 is substantially perpendicular to the first direction D1 and the second direction D2, and the first direction D1 is substantially perpendicular to the second direction D2.

The plurality of dielectric pillars 116 are alternately arranged and located on the word lines 104 in the first regions R1 and the second regions R2 at the two sides of the stack structures 114. More specifically, the dielectric pillars 116 extend along the third direction D3. The dielectric pillars 116 in the first regions R1 are disposed on the odd word lines 104 and contact the odd word lines 104, and the dielectric pillars 116 in the second region R2 are disposed on the even word lines 104 and contact the even word lines 104.

In the second direction D2, the gate pillar structures 108 and the dielectric pillars 116 are alternately arranged and contact each other. By using the dielectric pillars 116, the adjacent gate pillar structures 108 are electrically isolated from each other. In the first direction D1, the gate pillar structures 108 and the dielectric pillars 116 are arranged alternately and separately. In other words, each of the gate pillar structures 108 is located between two adjacent dielectric pillars 116, and the stack structures 114 are respectively disposed at two sides of the gate pillar structures 108. Each of the gate pillar structures 108 and adjacent stack structure 114 may respectively form a memory cell string having a single gate structure. In other words, each of the memory cell strings in this embodiment may be controlled by the single gate structure.

Moreover, referring to FIG. 1E, in the embodiments of the invention, profiles of the dielectric pillars 116 may be controlled when forming the dielectric pillars 116, such that contact surfaces of the dielectric pillars 116 and the gate pillar structures 108 have inclined or curved profiles. Here, a memory cell string M is described as an example. A contact area S1 of each of the conductive pillars 112 and the corresponding charge storage layer 110 may be greater than or equal to a contact area S2 of the charge storage layer 110 and the corresponding stack structure 114. The greater contact area S1 allows a preferable electrical control to the memory cell string M.

In view of the foregoing, in the embodiments of the invention, the plurality of gate pillar structures and the plurality of dielectric pillars that are alternately arranged are embedded in the stack layer, such that the stack layer is divided into the plurality of stripe-shaped stack structures. Since the gate pillar structures and the dielectric pillars are formed by forming holes and refilling the required materials, the same or different materials that the holes are not formed therein may provide support to each other when the holes are formed in the stack layer, thereby avoid collapsing or bending. In this way, the memory device and the method of fabricating the same according to the embodiments of the invention avoid the issue of bit line channel bending or word line bridging.

Furthermore, the dielectric pillars separate the adjacent gate pillar structures and the adjacent stack structures. In other words, the dielectric pillars may electrically isolate the adjacent memory cells. Thus, the interference between the adjacent memory cells is effectively reduced, and the performance of the memory cells or memory cell array is thus improved.

Furthermore, in the embodiments of the invention, the contact area of each of the conductive pillars and the corresponding charge storage layer is controlled to be greater than or equal to the contact area of the charge storage layer and the corresponding stack structure, thereby making the corresponding memory cell has a preferable electrical control.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A memory device, comprising:
a plurality of gate pillar structures and a plurality of dielectric pillars, alternately and separately arranged along a first direction, alternately arranged and contacting each other along a second direction, and embedded in a stack layer along a third direction, thereby dividing the stack layer into a plurality of stack struc- tures, wherein the first direction is different from the second direction and third direction, and a sidewall of each of the dielectric pillars in the second direction and a sidewall of the adjacent gate pillar structure in the second direction are not coplanar.

2. The memory device as claimed in claim 1, wherein a width of each of the dielectric pillars in the first direction is greater than or equal to a width of the adjacent gate pillar structure in the first direction.

3. The memory device as claimed in claim 1, wherein each of the gate pillar structures extends along the third direction and the gate pillar structures comprises:
 a plurality of conductive pillars; and
 a plurality of charge storage layers, wherein each of the charge storage layers is located at a periphery of the corresponding conductive pillar to electrically isolate the corresponding stack structure and conductive pillar, wherein a contact area of each of the conductive pillars and the corresponding charge storage layer is greater than or equal to a contact area of the charge storage layer and the corresponding stack structure.

4. The memory device as claimed in claim 1, wherein each of the stack structures comprises a plurality of insulating layers and a plurality of conductive layers, and the insulating layers and the conductive layers are stacked alternately along the third direction.

5. A memory device, comprising:
 a substrate, having a plurality of first regions, a plurality of second regions, and a plurality of third regions, wherein the first regions and the second regions are alternately arranged along a first direction, and each of the third regions is located between the corresponding first and second regions;
 a plurality of word lines, located on the substrate, wherein each of the word lines extends along the first direction and traverses the first regions, the second regions, and the third regions;
 a plurality of isolation structures, located on the substrate and between two adjacent word lines, wherein each of the isolation structures extends along the first direction and traverses the first regions, the second regions, and the third regions;
 a plurality of stack structures, located on the substrate in the third regions, wherein each of the stack structures extends along a second direction and traverses the word lines and the isolation structures;
 a plurality of gate pillar structures, located on the word lines, wherein each of the gate pillar structures extends along a third direction and the gate pillar structures comprises:
 a plurality of conductive pillars, wherein the conductive pillars are electrically connected with the even word lines in the first regions and electrically connected with the odd word lines in the second regions; and
 a plurality of charge storage layers, wherein each of the charge storage layers is located at a periphery of the corresponding conductive pillar to electrically isolate the corresponding stack structure and conductive pillar, the first direction is different from the second direction, and the first direction is different from the third direction; and
 a plurality of dielectric pillars, located on the word lines, wherein each of the dielectric pillars extends along the third direction, and the dielectric pillars contact the odd word lines in the first regions and contact the even word lines in the second regions.

6. The memory device as claimed in claim 5, wherein a shape of a sidewall of the stack structure in the third region between the gate pillar structures and the dielectric pillars in each of the first regions and the gate pillar structures and the dielectric pillars in the adjacent second region comprises a sawtoothed shape or a serpentine shape.

7. The memory device as claimed in claim 5, wherein each of the gate pillar structures and the adjacent dielectric pillar contacts each other on the corresponding isolation structure.

8. The memory device as claimed in claim 5, wherein a width of each of the dielectric pillars in the first direction is greater than or equal to a width of the adjacent gate pillar structure in the first direction.

9. The memory device as claimed in claim 5, wherein a contact area of each of the conductive pillars and the corresponding charge storage layer is greater than or equal to a contact area of the charge storage layer and the corresponding stack structure.

10. The memory device as claimed in claim 5, wherein each of the stack structures comprises a plurality of insulating layers and a plurality of conductive layers, and the insulating layers and the conductive layers are stacked alternately along the third direction.

11. The memory device as claimed in claim 5, wherein the third direction is perpendicular to the first direction and the second direction, and the first direction is perpendicular to the second direction.

12. A method for fabricating a memory device, comprising:
 forming a stack layer on a substrate; and
 forming a plurality of gate pillar structure and a plurality of dielectric pillars in the stack layer, the gate pillar structures and the dielectric pillars being arranged separately and alternately along a first direction, being arranged alternately and contacting each other along a second direction, and respectively being embedded in the stack layer along a third direction, thereby dividing the stack layer into a plurality of stack structures extending along the second direction, wherein the first direction is different from the second direction and the third direction, and a sidewall of each of the dielectric pillars in the second direction and a sidewall of the adjacent gate pillar structure in the second direction are not coplanar.

13. The method for fabricating the memory device as claimed in claim 12, comprising:
 providing a substrate having a plurality of first regions, a plurality of second regions, and a plurality of third regions, wherein the first regions and the second regions are alternately arranged along the first direction, and each of the third regions is located between the corresponding first and second regions;
 forming a plurality of word lines on the substrate, wherein each of the word lines extends along the first direction and traverses the first regions, the second regions, and the third regions;
 forming an isolation structure between two adjacent word lines, wherein each of the isolation structures extends along the first direction and traverses the first regions, the second regions and the third regions, and the word lines and the isolation structures are arranged alternately along the second direction;
 forming the stack layer on the substrate;
 forming a plurality of first holes in the stack layer on the word lines, wherein the first holes expose top surfaces of the even word lines in the first regions and expose top surfaces of the odd word lines in the second regions;

forming the gate pillar structure in each of the first holes, wherein each of the gate pillar structure comprises:

a plurality of conductive pillars, wherein the conductive pillars are electrically connected with the even word lines in the first regions and electrically connected with the odd word lines in the second regions; and a plurality of charge storage layers, wherein each of the charge storage layers is located at a periphery of the corresponding conductive pillar to electrically isolate the corresponding stack layer and the conductive pillar;

forming a plurality of second holes in the stack layer on the word lines, wherein the second holes expose top surfaces of the odd word lines in the first regions and expose top surfaces of the even word lines in the second regions, the second holes and the gate pillar structures are alternately arranged along the first direction and the second direction, each of the second holes contacts the adjacent gate pillar structure on the corresponding isolation structure, such that the stack layer is divided into the plurality of stack structures in the third regions, and the stack structures extend along the second direction; and forming the dielectric pillar in each of the second holes.

14. The method for fabricating the memory device as claimed in claim 13, wherein the step of forming the corresponding gate pillar structure in each of the first holes comprises:

forming a charge storage material layer on the substrate, wherein the charge storage material layer covers a top surface of the stack layer, sidewalls of the first holes, and top surfaces of the word lines;

removing a part of the charge storage material layer by performing an anisotropic etching process to expose the top surfaces of the stack layer and the word lines, thereby forming the charge storage layer on the side wall of each of the first holes; and forming the conductive pillar in each of the first holes, such that each of the charge storage layers is located at the periphery of the corresponding conductive pillar.

15. The method for fabricating the memory device as claimed in claim 13, wherein the step of forming the corresponding dielectric pillar in each of the second holes comprises:

forming a dielectric material layer on the substrate, wherein the dielectric material layer is filled in the second holes; and performing a planarization process to the dielectric material layer to expose top surfaces of the gate pillar structures and the stack structures.

16. The method for fabricating the memory device as claimed in claim 13, wherein a shape of the stack structure in the third region between the gate pillar structures and the dielectric pillars in each of the first regions and the gate pillar structures and the dielectric pillars in the adjacent second region comprises a sawtoothed shape or a serpentine shape.

17. The method for fabricating the memory device as claimed in claim 12, wherein a width of each of the dielectric pillars in the first direction is greater than or equal to a width of the adjacent gate pillar structure in the first direction.

18. The method for fabricating the memory device as claimed in claim 12, wherein a contact area of each of the conductive pillars and the corresponding charge storage layer is greater than or equal to a contact area of the charge storage layer and the corresponding stack structure.

19. The method for fabricating the memory device as claimed in claim 12, wherein the stack layer comprises a plurality of insulating layers and a plurality of conductive layers, and the insulating layers and the conductive layers are stacked alternately along the third direction.

20. The method for fabricating the memory device as claimed in claim 12, wherein the third direction is perpendicular to the first direction and the second direction, and the first direction is perpendicular to the second direction.

* * * * *